(12) United States Patent
Liu et al.

(10) Patent No.: US 7,305,223 B2
(45) Date of Patent: Dec. 4, 2007

(54) RADIO FREQUENCY CIRCUIT WITH INTEGRATED ON-CHIP RADIO FREQUENCY SIGNAL COUPLER

(75) Inventors: Lianjun Liu, Gilbert, AZ (US); Jonathan K. Abrokwah, Chandler, AZ (US); Marcus R. Ray, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 229 days.

(21) Appl. No.: 11/021,843

(22) Filed: Dec. 23, 2004

(65) Prior Publication Data

US 2006/0141979 A1   Jun. 29, 2006

(51) Int. Cl.
*H04B 1/28* (2006.01)

(52) U.S. Cl. .................. 455/333; 455/338; 455/334; 333/204; 333/212; 257/528; 257/531; 257/532

(58) Field of Classification Search .............. 455/333, 455/550.1, 575.1, 561, 425, 424, 456.5, 456.6, 455/307, 286, 334, 338, 280, 281, 325, 339, 455/126, 127.1, 327, 319, 116, 260, 124; 333/116, 185, 204, 219, 115, 238, 184, 167, 333/181–183, 109, 108, 212; 257/531, 595, 257/310, 281, 347, 368, 379, 532, 533, 664, 257/690, 724, 516, 528; 505/204, 210; 438/381, 438/599; 330/302, 305, 307; 336/200, 232, 336/223; 361/69
See application file for complete search history.

(56) References Cited

U.S. PATENT DOCUMENTS

| | | | |
|---|---|---|---|
| 5,212,815 A | | 5/1993 | Schumacher et al. |
| 5,939,753 A | * | 8/1999 | Ma et al. ................. 257/339 |
| 6,370,404 B1 | * | 4/2002 | Shen ...................... 505/210 |
| 6,448,873 B1 | * | 9/2002 | Mostov ................... 333/185 |
| 6,590,473 B1 | * | 7/2003 | Seo et al. ................. 333/185 |
| 6,759,922 B2 | | 7/2004 | Adar et al. |
| 6,952,147 B2 | * | 10/2005 | Gurvich et al. ........... 333/116 |
| 7,084,720 B2 | * | 8/2006 | Gomez et al. ............ 333/204 |
| 7,088,201 B2 | * | 8/2006 | Piernas .................... 333/116 |
| 2003/0076191 A1 | * | 4/2003 | Iida et al. ................. 333/116 |

* cited by examiner

*Primary Examiner*—Nguyen T. Vo
*Assistant Examiner*—Charles Chow
(74) *Attorney, Agent, or Firm*—Ingrassia Fisher & Lorenz, P.C.

(57) ABSTRACT

A radio frequency ("RF") circuit configured in accordance with an embodiment of the invention is fabricated on a substrate using integrated passive device ("IPD") process technology. The RF circuit includes at least one RF signal line section and an integrated RF coupler located proximate to the RF signal line section. The integrated RF coupler, its output and grounding contact pads, and its matching network are fabricated on the same substrate using the same IPD process technology. The integrated RF coupler provides efficient and reproducible RF coupling without increasing the die footprint of the RF circuit.

12 Claims, 5 Drawing Sheets

RADIO FREQUENCY CIRCUIT WITH INTEGRATED ON-CHIP RADIO FREQUENCY SIGNAL COUPLER

TECHNICAL FIELD

The present invention relates generally to electronic components. More particularly, the present invention relates to radio frequency ("RF") couplers for use with electronic components that employ integrated passive devices.

BACKGROUND

The prior art is replete with electronic devices and components designed for high frequency data communication applications. A common practical application for such devices and components is cellular telephony systems. In this regard, the need for component integration will increase as module sizes decrease for high performance cellular phones with advanced features. Cellular phone radio transmitters use several passive components for functions such as filtering, impedance matching, and switching. Several of these components can be integrated to improve module parameter control and cost. A harmonic filter is used for signal selectivity over radio bands, while an RF coupler is used for signal level sensing and control. For example, an RF coupler may be used to couple an RF signal in a transmit path to a detector for signal power level control. In conventional applications, an RF coupler and a harmonic filter are two separate components, each having a physical size of approximately 1 mm$^2$. In such applications, the use of distinct components necessarily adds to the overall footprint of the module, while increasing manufacturing and assembly cost. In addition, the use of a separate RF coupler requires different device fabrication processes, which in turn may lead to unpredictable coupling performance, impedance matching, and other operating characteristics.

Accordingly, it is desirable to have a compact, low cost, RF device that includes an integrated RF coupler having predictable coupling characteristics. In practical applications, it is desirable to incorporate an RF coupler into an electronic device having an RF signal line in a manner that does not significantly increase the physical size of the electronic device. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or schematic components. It should be appreciated that such components may be realized in any number of practical ways. For example, an embodiment of the invention may employ various elements, e.g., conductive traces, wire bonds, integrated passive devices, semiconductor substrate materials, dielectric materials, or the like, which may have characteristics or properties known to those skilled in the art. In addition, those skilled in the art will appreciate that the present invention may be practiced in conjunction with any number of practical radio frequency ("RF") circuit topologies and applications and that the harmonic filter circuits described herein are merely example applications for the invention.

For the sake of brevity, conventional techniques related to RF circuit design, RF signal coupling, RF impedance matching, semiconductor process technology, integrated passive device fabrication, and other aspects of the circuits (and the individual operating components of the circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

Figure 1:
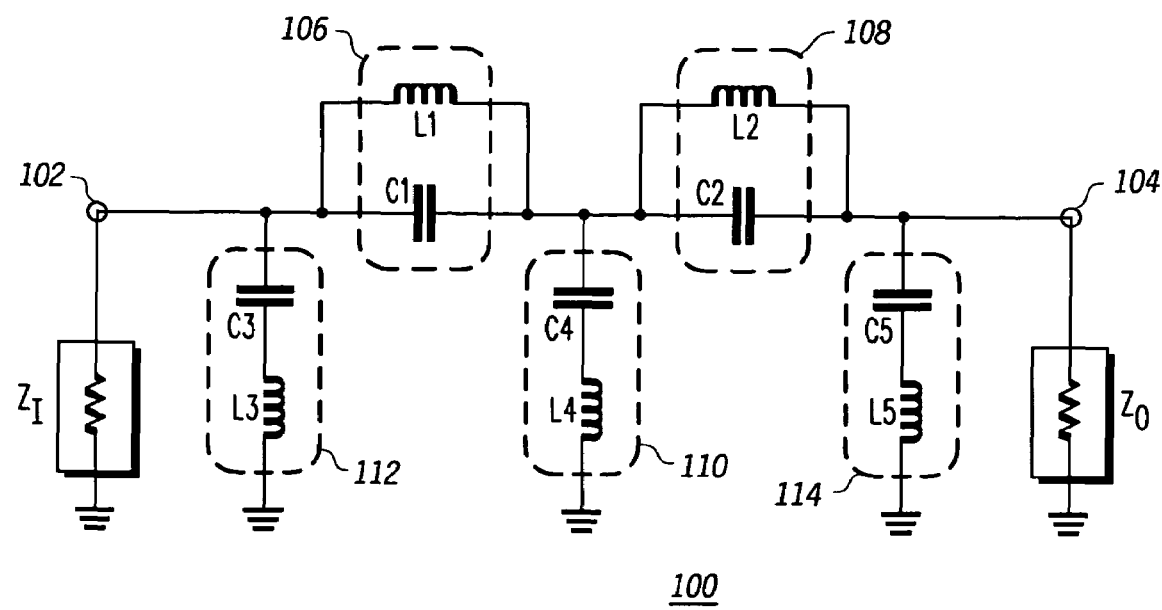
FIG. 1 is a schematic circuit diagram of a harmonic filter topology in accordance with an example embodiment of the invention.

The following description refers to elements or features being "connected" together. As used herein, unless expressly stated otherwise, "connected" means that one element/feature is directly or indirectly connected to another element/feature, and not necessarily mechanically. For example, although the schematic shown in FIG. 1 depicts one example arrangement of elements, additional intervening elements, devices, features, or components may be present in an actual embodiment (assuming that the functionality of the circuit is not adversely affected).

An electronic device configured in accordance with an embodiment of the invention includes an integrated RF coupler. The RF coupler is formed on the same substrate as the RF section of the electronic device, and the electronic device and the RF coupler are fabricated using the same semiconductor process technology. The electronic device with integrated RF coupler can be realized without an increase in the footprint of the device, thus reducing the overall size and packaging requirements of the integrated device.

The above and other aspects of the invention may be carried out in one form by an electronic device including a semiconductor substrate, an RF circuit formed on the semiconductor substrate, the RF circuit having an RF signal line section, and an RF coupler formed on the same semiconductor substrate. The RF coupler includes a coupling section located proximate to the RF signal line section.

The above and other aspects of the invention may also be carried out by an electronic device having a semiconductor substrate, an RF circuit formed on the semiconductor substrate, the RF circuit having an RF signal line section, and an RF coupler formed on the same semiconductor substrate. The RF coupler includes a coupling section located proximate to the RF signal line section, and the coupling section is parallel to an edge of the RF signal line section.

The above and other aspects of the invention may also be carried out by an electronic device having a semiconductor substrate, an RF circuit formed on the semiconductor substrate, the RF circuit having an RF signal line section, and an RF coupler formed on the same semiconductor substrate. The RF coupler includes a coupling section located proximate to the RF signal line section, and at least a portion of the coupling section is located above the RF signal line section.

The above and other aspects of the invention may also be carried out by an electronic device having a semiconductor substrate, an RF circuit formed on the semiconductor substrate, the RF circuit having an RF signal line section having a first side and a second side opposing the first side, and an RF coupler formed on the same semiconductor substrate. The RF coupler includes a first coupling section located proximate to the first side of the RF signal line section, and a second coupling section located proximate to the second side of the RF signal line section. In addition, the RF signal line section is formed from a first metal layer on the semiconductor substrate, while the coupling section is formed from a second metal layer on the semiconductor substrate.

The above and other aspects of the invention may also be carried out by an electronic device having a semiconductor substrate, an RF harmonic filter circuit formed on the semiconductor substrate, the RF harmonic filter circuit having an RF signal line section having a first side and a second side opposing the first side, and an RF coupler formed on the same semiconductor substrate. The RF coupler includes a first coupling section located proximate to the first side of the RF signal line section, and a second coupling section located proximate to the second side of the RF signal line section.

The above and other aspects of the invention may also be carried out by an electronic device fabrication method that involves forming an RF coupler on a substrate using a semiconductor process technology, the RF coupler having a coupling section, forming an RF signal line section on the substrate using the same semiconductor process technology, the RF signal line section being located proximate to the coupling section, and forming at least one integrated passive device on the substrate using the same semiconductor process technology, the at least one integrated passive device being connected to the RF signal line section. The method also involves forming a harmonic filter on the substrate using the same semiconductor process technology, where the harmonic filter includes the RF signal line section and the at least one integrated passive device.

The above and other aspects of the invention may also be carried out by an electronic device fabrication method that involves forming an RF coupler on a substrate using a semiconductor process technology, the RF coupler having a coupling section, forming an RF signal line section on the substrate using the same semiconductor process technology, the RF signal line section being located proximate to the coupling section, and forming at least one integrated passive device on the substrate using the same semiconductor process technology, the at least one integrated passive device being connected to the RF signal line section. The RF signal line section is formed from a first metal layer on the substrate, while the coupling section is formed from a second metal layer on the substrate.

The above and other aspects of the invention may also be carried out by an electronic device fabrication method that involves forming an RF coupler on a substrate using a semiconductor process technology, the RF coupler having a coupling section, forming an RF signal line section on the substrate using the same semiconductor process technology, the RF signal line section being located proximate to the coupling section, and forming at least one integrated passive device on the substrate using the same semiconductor process technology, the at least one integrated passive device being connected to the RF signal line section. The coupling section and the RF signal line section are formed such that at least a portion of the coupling section is located above the RF signal line section.

Figure 2:
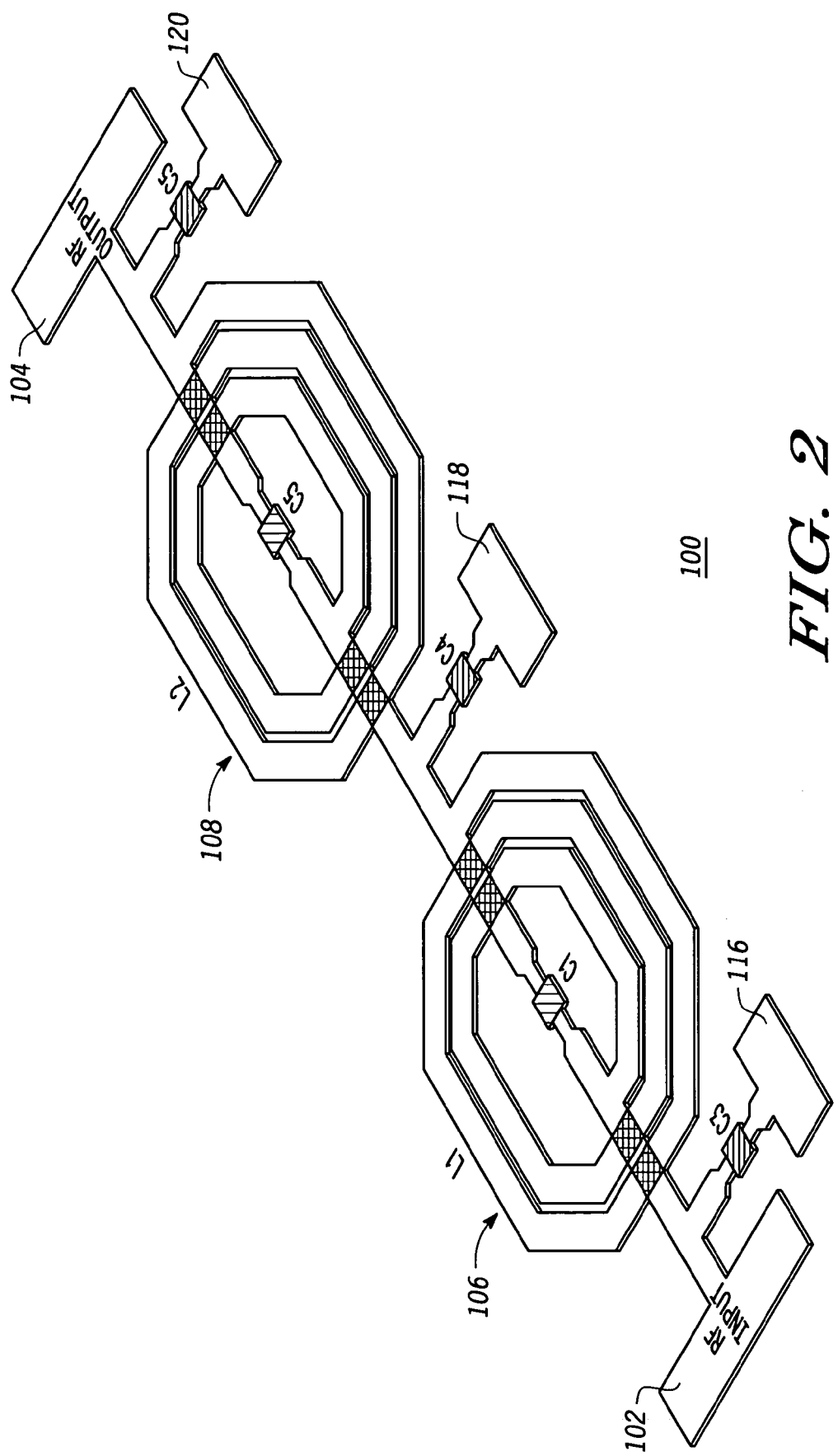
FIG. 2 is a perspective view of an example device layout for the harmonic filter shown in FIG. 1.

FIG. 1 is a schematic diagram showing the general topology of an RF harmonic filter 100, and FIG. 2 is a perspective view of an example integrated passive device ("IPD") layout for harmonic filter 100. An RF signal enters harmonic filter 100 at an input port 102, and a filtered RF signal within the desired RF band is provided at an output port 104. In the practical layout shown in FIG. 2, the RF energy propagates over conductive traces formed on an insulating (semiconducting) substrate. Harmonic content associated with the RF input signal is rejected by three harmonic resonance circuits: a second harmonic circuit 106; a third harmonic circuit 108; and a fourth harmonic circuit 110. Second harmonic circuit 106 is realized as an LC tank circuit (inductor L1 in parallel with capacitor C1), third harmonic circuit 108 is realized as an LC tank circuit (inductor L2 in parallel with capacitor C2), and fourth harmonic circuit 110 is realized as an LC series combination (capacitor C4 in series with inductor L4). Harmonic filter 100 also includes an input impedance matching circuit 112 and an output impedance matching circuit 114. Input impedance matching circuit 112 is realized as an LC series combination (capacitor C3 in series with inductor L3), and output impedance matching circuit 114 is realized as an LC series combination (capacitor C5 in series with inductor L5). The specific inductor and capacitor values of harmonic filter 100 are selected according to the desired filtering characteristics and the desired output frequency band. For example, harmonic filter 100 may be suitably configured for operation with AMPS/GSM applications (824-915 MHz) or DCS/PCS applications (1710-1910 MHz).

In practice, IPDs (Integrated Passive Devices) can be used to effectively reduce component and module sizes. As used herein, an IPD is a passive electronic device or a passive electronic component that can be fabricated using semiconductor process technology. An IPD can be produced with very high precision, excellent reproducibility, and low cost in high quantities by utilizing semiconductor wafer processing technologies. The layout of harmonic filter 100 shown in FIG. 2 represents an IPD realization, where all of the depicted elements are formed on the same substrate (e.g., a semiconductor or insulating substrate such as GaAs, glass, or ceramic) using the same semiconductor process technology (i.e., the fabrication or manufacturing process by which the IPD is formed). In FIG. 2, inductors L1 and L2 are realized as conductive RF signal line loops (air bridges are employed at the four "intersections" of each inductor to insulate the inductor loops from the respective C1 and C2 transmission lines), and the capacitors are formed as IPDs on the substrate in the desired locations. Notably, inductors L3, L4, and L5 (not shown in FIG. 2) are realized as wire bonds between respective contact pads (numbered 116, 118, and 120 in FIG. 2) and ground pads, which may be off-chip. Thus, inductors L3, L4, and L5 are not actually part of the IPD itself, and harmonic filter 100 may be referred to as a "two inductor" IPD.

Figure 3:
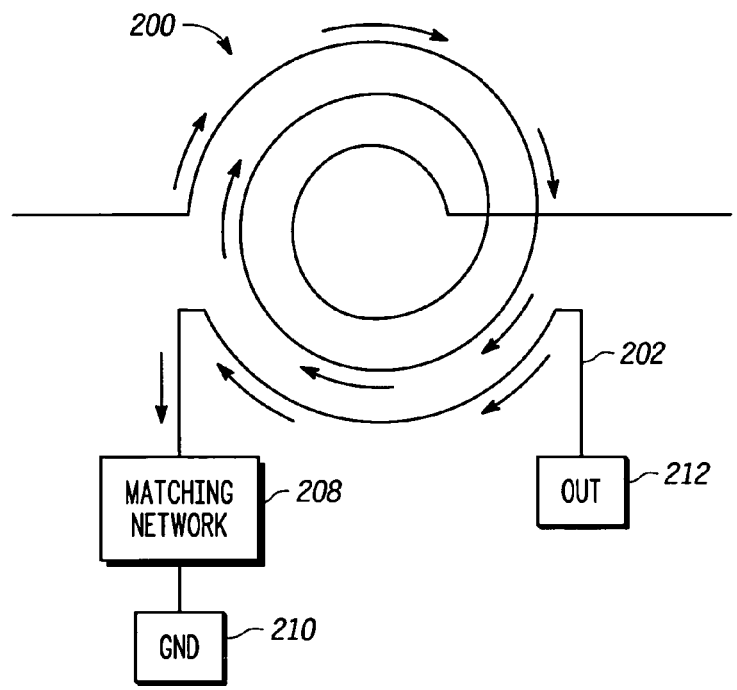
FIG. 3 is a schematic representation of an RF inductor and an RF coupler arranged in accordance with an example embodiment of the invention.
Figure 4:
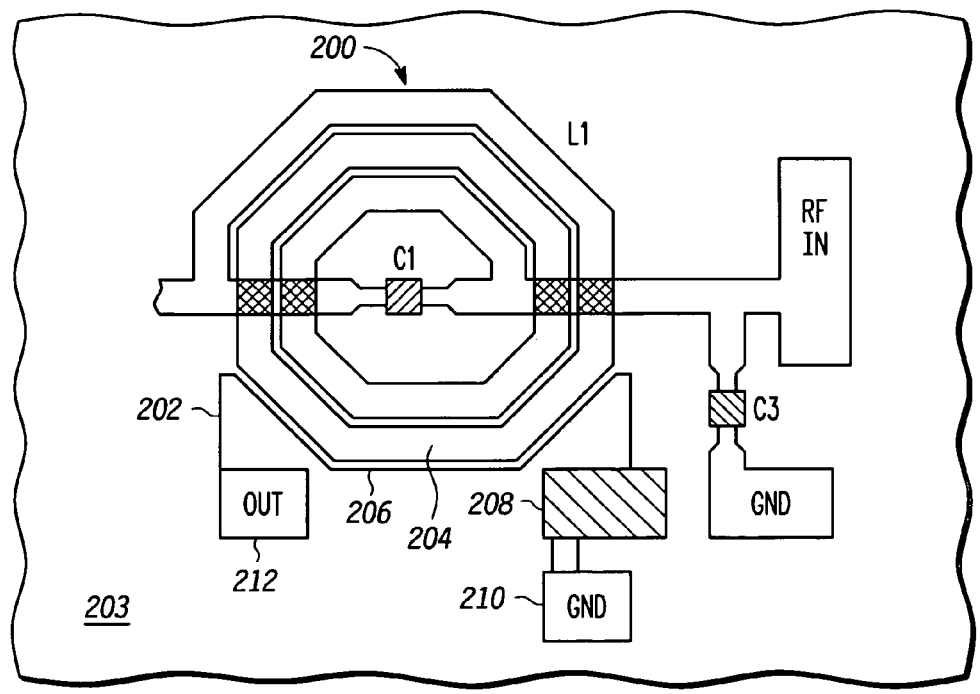
FIG. 4 is a top view of an example device layout for an RF inductor and an RF coupler formed on a common substrate in accordance with an example embodiment of the invention.

In accordance with a preferred embodiment of the invention, an RF coupler is formed on the same substrate, using the same semiconductor process technology, as the corresponding RF circuit (e.g., a harmonic filter circuit). In this manner, an RF coupler can be integrated with the RF circuit by forming a conductive trace proximate to any suitably accessible RF signal line section of the RF circuit. In this regard, FIG. 3 is a schematic representation of an RF inductor 200 and an RF coupler 202 arranged in accordance with an example embodiment of the invention, and FIG. 4 is a top view of an example device layout for RF inductor 200 and RF coupler 202, as may be formed on a common semiconductor substrate 203. In this example, FIG. 4 corresponds to the input section of a harmonic filter such as that shown in FIG. 1. Each of the RF circuits shown in FIG. 3 and FIG. 4 includes a matching network 208, a ground contact pad 210, and an output contact pad 212 (described in more detail below).

In accordance with known semiconductor fabrication techniques, RF inductor 200, RF coupler 202, the IPD components, and other elements of the RF circuit shown in FIG. 4 may be formed on a common semiconductor substrate using a plurality of metal layers and a number of dielectric layers. The metal layers are deposited and the desired conductive traces are etched or otherwise formed from the metal layers. The metal layers are typically referred to as "metal 1," "metal 2," "metal 3," and so on to indicate the order in which they are deposited or formed onto the substrate during the fabrication process. In accordance with one practical embodiment, RF coupler 202 is formed from the metal 1 layer, at least portions of the capacitors and resistors are formed from the metal 2 layer, and the loops of RF inductor 200 are formed from the metal 3 layer. In accordance with one practical semiconductor process technology, metal 1 elements are approximately 0.6 µm to 2.0 µm thick, metal 2 elements are approximately 2.5 µm thick, and metal 3 elements are approximately 10 µm thick.

The RF circuit may include one or more RF signal line sections 204 and one or more IPD components formed on the substrate 203. For example, FIG. 4 depicts two IPD capacitors (labeled C1 and C3) and IPD RF inductor 200 (labeled L1) associated with the RF circuit. The width of the RF signal line sections 204, the number of loops formed by RF inductor 200, and other dimensions of the layout are selected to suit the particular application. In accordance with one example embodiment, all sections of RF inductor 200, including RF signal line section 204, are formed from gold metallization that is approximately 10 µm wide.

RF coupler 202 may include one or more coupling sections 206 and one or more IPD components formed on the common substrate 203. For example, FIG. 4 depicts an IPD matching network 208 connected to a contact pad 210, which can be wire bonded to an off-chip ground pad. Matching network 208 is connected to one end of the conductive trace that forms RF coupler 202. In other words, one side (the isolation side) of RF coupler 202 is connected to ground via the matching network 208. In practical embodiments, matching network 208 may be realized as a terminating IPD resistor or a parallel combination of one or more IPD resistors and one or more IPD capacitors. The value of the components in matching network 208 are selected to provide a good impedance match to coupling section 206, i.e., the transmission line of RF coupler 202. A good impedance match is important to establish good coupler directivity. The other end of the conductive trace that forms RF coupler 202 may be connected to an output contact pad 212, which can be wire bonded to another contact pad or off-chip element for providing the coupled RF signal.

In practice, the width of coupling section 206 is relatively narrow to establish a high impedance, thus reducing the need for impedance transformation at the coupled output port. In accordance with the example embodiment, coupling section 206 is formed from gold metallization that is approximately 2 µm wide. The amount of coupling achieved by RF coupler 202 is primarily dictated by the length of coupling section 206 and the separation gap between coupling section 206 and the corresponding RF signal line section 204 that is located proximate to coupling section 206. For the example embodiment, the separation gap is approximately 1-2 µm. The separation gap should be consistent along the length of coupling section 206. In practice, coupling section 206 is adjacent to, and parallel to, RF signal line section 204. More specifically, coupling section 206 is adjacent to, and parallel to, the outer edge of RF signal line section 204 in this example embodiment. In operation, a small amount of the RF signal in RF inductor 200 couples into RF coupler 202. In this example, RF coupler 202 is configured to sense the RF input level.

The effectiveness of an RF coupler is measured by the coupling factor, the directivity, and isolation, where coupling is measured as S-parameter $S_{31}$ in a 4-port RF network. The directivity is the difference of $S_{23}$ and $S_{21}$, and isolation is the absolute sum of coupling and directivity, expressed in dB. Typical values are −15 dB to −20 dB coupling and 14 dB to 20 dB directivity. As mentioned above, matching network 208 may be realized as a termination resistor to increase the coupler impedance for matching purposes and to force good directivity (higher resistance values lead to better directivity and higher impedance). The termination may include a reactive component such as capacitor in parallel with the resistor to provide some frequency tuning of the termination impedance. In practical embodiments, the placement of the resistor with respect to RF inductor 200 is important. To ensure a positive directivity, the current vectors $J_{inductor}$ and $J_{coupler}$ must be in the same direction near RF inductor 200. In FIG. 3, the arrows flowing around RF inductor 200 represent the $J_{inductor}$ current vectors, while the arrows flowing around RF coupler 202 represent the $J_{coupler}$ current vectors. As depicted in FIG. 3, matching network 208 is placed near the end of the conductive trace that forms RF coupler 202, because current flows to ground in RF coupler 202. In contrast, placing matching network 208 on the opposite end (near output contact pad 212) closer to where current enters the coupler would result in reverse coupling since the RF signal level will be higher at that location.

Referring back to FIG. 2, an RF coupler may be placed by the L2 inductor on the output side of the harmonic filter circuit to enable sensing of the RF signal output to the next stage of the radio module. The output RF coupler may be deployed in addition to, or in lieu of, the input RF coupler. If an output RF coupler is utilized, a suitable terminating resistor or matching network is preferably configured and located as discussed above to provide positive coupling.

Notably, RF coupler 202 can be realized on an area of substrate 203 that would otherwise be unoccupied. Consequently, the integration of RF coupler 202 with the RF circuit need not result in an increased die size or an increased package size. Furthermore, RF coupler 202 is fabricated using the same semiconductor process technology as the RF circuit, which makes it easy to implement in a practical embodiment.

Figure 5:
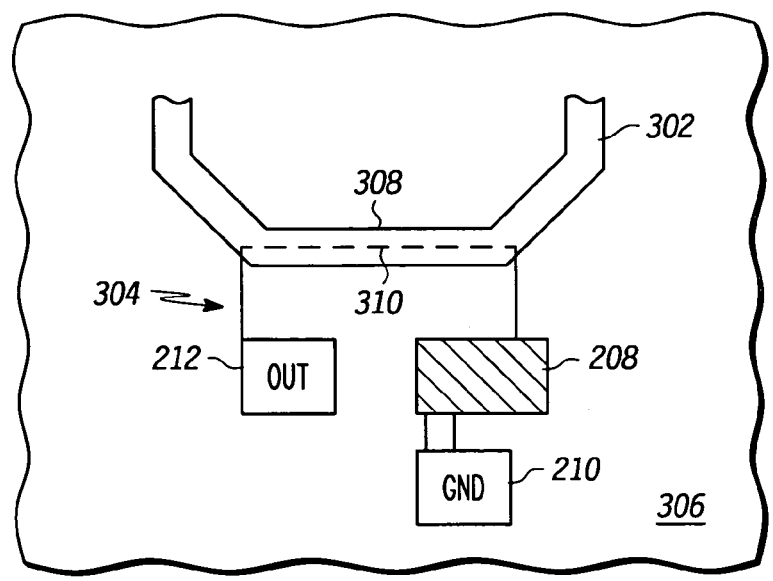
FIGS. 5-8 are top views of different example device layouts for a portion of an RF signal line and an RF coupler formed on a common substrate in accordance with example embodiments of the invention.

FIG. 5 is a top view of an example device layout for an RF circuit 300. FIG. 5 only depicts a portion of an RF signal line 302 from RF circuit 300, along with an RF coupler 304 formed on a common substrate 306. Certain aspects and features of RF circuit 300 may be shared with the RF circuit shown in FIG. 4, and shared features will not be redundantly described herein. Briefly, at least a portion of RF coupler 304 is located below a corresponding portion of RF signal line 302. In practice, a dielectric layer (not shown) resides between RF coupler 304 and RF signal line 302. This configuration may be desirable in applications that require increased RF coupling relative to the configuration shown in FIG. 4.

RF signal line 302 includes a straight section 308 formed above and parallel to a coupling section 310 of RF coupler 304. Although not a requirement of the invention, coupling section 310 spans the entire length of straight section 308. Capacitive coupling due to the effect of RF signal line 302, RF coupler 304, and the separating dielectric layer results in a significant increase in RF coupling, relative to the configuration shown in FIG. 4. In a practical embodiment, the transmission line of RF coupler 304, including coupling section 310, is formed from the metal 1 layer, and RF signal line 302 is formed from the metal 3 layer. The dielectric layer between coupling section 310 and straight section 308 is deposited or otherwise formed before the metal 3 layer is formed. In an alternate embodiment of RF circuit 300, coupling section 310 is located above RF signal line 302 rather than below RF signal line 302. In such an alternate embodiment, RF signal line 302 and the dielectric layer are formed before coupling section 310.

Figure 6:
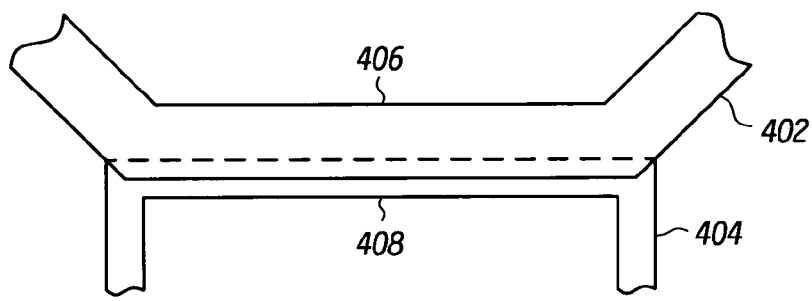

FIG. 6 is a top view of an example device layout for a portion of an RF signal line 402 and a portion of an RF coupler 404, configured in accordance with an alternate embodiment of the invention. Certain aspects and features of the RF circuit shown in FIG. 6 may be shared with the RF circuits shown in FIG. 4 and FIG. 5, and shared features will not be redundantly described herein. FIG. 6 depicts an embodiment where a straight section 406 of RF signal line 402 partially overlaps a coupling section 408 of RF coupler 404. In other words, the projection of the outer edge of RF signal line 402 falls within the width of coupling section 408. In practice, the transmission line of RF coupler 404, which includes coupling section 408, is formed on a different layer than RF signal line 402 (preferably below, but possibly above RF signal line 402), and a dielectric layer separates coupling section 408 from RF signal line 402. This configuration may be desirable in applications where high capacitive coupling is either unnecessary or unwanted.

Figure 7:
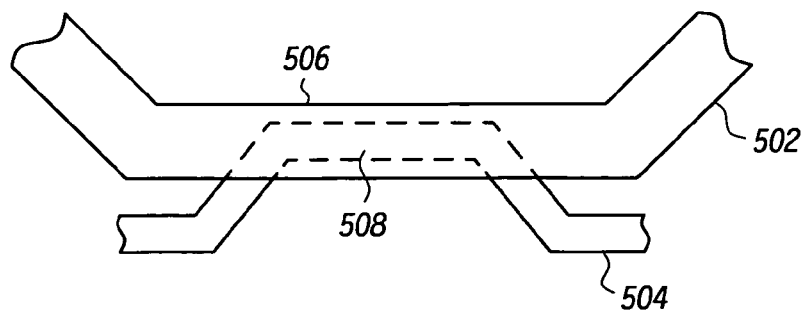

FIG. 7 is a top view of an example device layout for a portion of an RF signal line 502 and a portion of an RF coupler 504, configured in accordance with another alternate embodiment of the invention. Certain aspects and features of the RF circuit shown in FIG. 7 may be shared with the RF circuits shown in FIG. 4 and FIG. 5, and shared features will not be redundantly described herein. FIG. 7 depicts an embodiment where a straight section 506 of RF signal line 502 completely overlaps a short stub coupling section 508 of RF coupler 504. In contrast, the configuration shown in FIG. 5 employs a coupling section 310 that spans the entire length of the straight section 308. In an alternate embodiment, RF signal line 502 may only partially overlap coupling section 508, as shown in FIG. 6. In practice, the transmission line of RF coupler 504, which includes coupling section 508, is formed on a different layer than RF signal line 502 (preferably below, but possibly above RF signal line 502), and a dielectric layer separates coupling section 508 from RF signal line 502. This configuration may be desirable in applications where high capacitive coupling is either unnecessary or unwanted.

Figure 8:
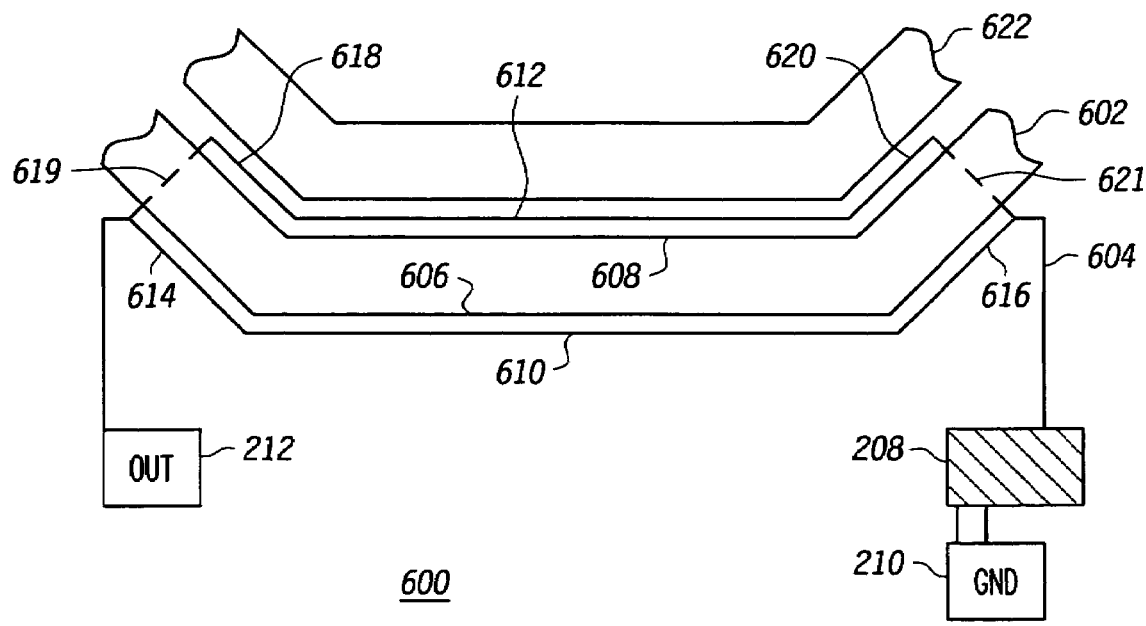

FIG. 8 is a top view of a portion of a device layout for an RF circuit 600. FIG. 8 only depicts a portion of an RF signal line section 602 from RF circuit 600, along with an RF coupler 604 formed on a common substrate. Certain aspects and features of RF circuit 600 may be shared with the RF circuit shown in FIG. 4, and shared features will not be redundantly described herein. In this regard, RF signal line section 602 may be a portion of an IPD inductor in a harmonic filter.

signal line section 602 includes a first side 606 (corresponding to the outer edge) and a second side 608 (corresponding to the inner edge) opposing first side 606. In the example embodiment, first side 606 is parallel to second side 608. RF coupler 604 includes a first coupling section 610 located proximate to first side 606 and a second coupling section 612 located proximate to second side 608. In the preferred embodiment, first coupling section 610 is adjacent and parallel to first side 606, and second coupling section 612 is adjacent and parallel to second side 608. First coupling section 610 is connected to second coupling section 612, which facilitates increased RF coupling without introducing capacitive coupling.

the example embodiment, first coupling section 610 has an output end 614 and a grounded end 616, second coupling section 612 has an output end 618 and a grounded end 620, the output ends 614/618 are connected together via a connection section 619, and the grounded ends 616/620 are connected together via a connection section 621. The output ends 614/618 are also connected to output contact pad 212, and the grounded ends 616/620 are also connected to ground contact pad 210 via matching network 208. In accordance with one preferred practical embodiment, the transmission line for RF coupler 604 is initially formed, followed by RF signal line section 602. Consequently, RF signal line section 602 is fabricated to include suitably configured bridges that span connection sections 619/621. Dielectric material may be located between the bridges and connection sections 619/621, or RF signal line section 602 may form air bridges across connection sections 619/621. In an alternate embodiment where RF signal line section 602 is initially formed, followed by the transmission line for RF coupler 604, connection sections 619/621 may form bridges (dielectric bridges or air bridges) that span RF signal line section 602 at the desired locations.

Although not shown in FIG. 8, RF coupler 604 may include a third coupling section proximate the inner edge of another RF signal line section 622 (in this example, RF signal line section 622 represents another loop section of the IPD inductor, i.e., a continuation of RF signal line section 602). The third coupling section can be connected at both ends to second coupling section 612 using bridges as described above. This technique may be extended to other RF signal line sections if so desired.

Figure 9:
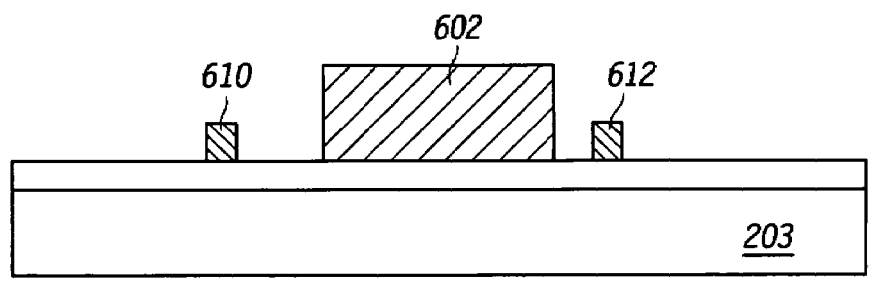
FIG. 9 is a simplified cross sectional view of the RF signal line and RF coupler shown in FIG. 8.

As mentioned above, the separation gap between a coupling section and the RF signal line section determines the RF coupling factor. In practice, however, manufacturing variations may result in actual separation gaps that differ from the ideal or nominal separation gaps. A single "leg" coupler (e.g., as shown in FIG. 4) may be susceptible to such process variations because a slight difference in the separation gap will impact the RF coupling characteristics. In contrast, a multiple "leg" coupler (e.g., as shown in FIG. 8) is somewhat immune to process misalignments due to the cancellation effect of the multiple coupling sections. In this regard, FIG. 9 (a simplified cross sectional view of RF signal line section 602 and RF coupler 604) illustrates the misalignment issue. Ideally, first coupling section 610 and second coupling section 612 would be evenly spaced from RF signal line section 602, forming equal separation gaps on either side of RF signal line section 602. However, when the metal layer forming coupling sections 610/612 is deposited and etched onto substrate 203, the pattern may be shifted from the ideal design, resulting in misalignment of coupling sections 610/612, as depicted in FIG. 9. Both coupling sections 610/612 are shifted together such that the gap between first coupling section 610 and RF signal line section 602 increases, while the gap between second coupling section 612 and RF signal line section 602 decreases. Consequently, the amount of coupling contributed by first coupling section 610 decreases while the amount of coupling contributed by second coupling section 612 increases, thus compensating for the decreased coupling of first coupling section 610. This cancellation effect allows RF coupler 604 to have more predictable and reproducible performance characteristics over the practical range of manufacturing tolerances.

It should be appreciated that RF circuit 600 in FIG. 8 may utilize any of the alternate configurations shown in FIGS. 5-7, namely, partial or complete overlapping between RF signal line section 602 and either or both coupling sections 610/612. The compensating feature of the multiple coupling sections 610/612 applies regardless of the layout topology.

example semiconductor process technology for fabricating an RF circuit with an integrated RF coupler may begin with an insulating or semiconducting substrate such as GaAs, glass, or ceramic. A suitable dielectric, such as SiN, is then deposited, followed by IPD resistor metal deposition. Refractory metals such as TiW or TiWN may be used for the resistor metal. After photo resist definition, the resistor metal may be reactive ion etched. The patterned metal 1 layer is then formed using deposit-etch or lift-off techniques. The bottom electrode of metal-insulator-metal capacitors and the RF coupler transmission line, including one or more coupling sections as described above, may be formed in this metal 1 layer. Another dielectric layer is deposited to serve as an insulator between the metal 1 and metal 2 layers, and to serve as the insulator of the IPD capacitors. Then, the patterned metal 2 layer is formed using deposit-etch or lift-off techniques. The top electrode of the IPD capacitors may be formed in this layer. Next, another dielectric layer is deposited to serve as an insulator between the metal 2 and metal 3 layers. The air bridge pattern is formed using photoresist techniques, and the patterned metal 3 layer is then formed using deposit-etch or lift-off techniques. The inductor winding may be formed in the metal 3 layer. In practice, the inductor is fabricated using metal 1 and metal 2 stack for the underpass and metal 3 (10 μm gold) for the inductor rings. Finally, the photoresist air bridge layer can be removed, followed by deposition and pattern of the dielectric passivation layer.

As set forth in more detail above, the inductor rings serve as RF signal line sections for coupling with the RF coupler. Depending upon the specific embodiment, the RF coupler transmission line may be adjacent to the RF signal line, partially below the RF signal line, or completely below the RF signal line. If, however, the RF coupler transmission line is formed after formation of the RF signal line, then it may be located adjacent to the RF signal line, partially above the RF signal line, or completely above the RF signal line. Again, the RF signal line sections are preferably formed from metal 3. If the RF circuit employs a multiple leg RF coupler (see FIG. 8), then one or more bridges are formed in the appropriate RF signal line sections. The bridges (air or dielectric bridges) span the connecting sections of the RF coupler transmission line, as shown in FIG. 8.

Metal 1 is typically 1 μm thick gold, metal 2 is typically 2.5 μm thick gold, and metal 3 is typically 10 μm thick gold. The dielectric layer between the metal 1 and metal 2 layers may be SiN having a thickness of approximately 1000 Angstroms. This combination can be used as an IPD capacitor, e.g., a metal-insulator-metal stack, providing a capacitor density of 650 pF/mm$^2$. Of course, other specific capacitor parameters can be utilized in a practical embodiment. The dielectric between the metal 1 and metal 3 layers is also SiN, and the thickness of the dielectric between the metal 2 and metal 3 layers is approximately 1000 Angstroms.

Notably, the RF coupler is formed on the same substrate as the RF circuit, using the same semiconductor process technology. In other words, the metal and dielectric materials, the deposition techniques, the etching techniques, and other fabrication techniques need not be customized to produce the RF coupler. The RF coupler can be integrated onto the same chip/die without increasing the physical size of the chip/die, which is desirable for small scale compact applications such as mobile communication devices.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. An electronic device comprising:
   a semiconductor substrate;
   a radio frequency ("RF") circuit formed on said semiconductor substrate, said RF circuit comprising:
     an RF input port formed on said semiconductor substrate;
     an integrated passive inductor formed on said semiconductor substrate, said integrated passive inductor having an input end coupled to said RF input port, an output end, and an RF signal line section between said input end and said output end; and
     an integrated passive capacitor formed on said semiconductor substrate in parallel with said integrated passive inductor; and
   an RF coupler formed on said semiconductor substrate, said RF coupler comprising a coupling section located proximate to said RF signal line section; wherein
   said RF input port, said integrated passive inductor, said integrated passive capacitor, and said RF coupler are all formed during the same semiconductor fabrication process.

2. An electronic device according to claim 1, said RF signal line section being formed from a first metal layer on said semiconductor substrate; and said coupling section being formed from a second metal layer on said semiconductor substrate.

3. An electronic device according to claim 1, said coupling section being parallel to said RF signal line section.

4. An electronic device according to claim 1, said coupling section being adjacent to said RF signal line section.

5. An electronic device according to claim 1, at least a portion of coupling section being located below said RF signal line section.

6. An electronic device according to claim 1, said RF circuit being configured as a harmonic filter.

7. An electronic device comprising:
   a semiconductor substrate;
   a radio frequency ("RF") circuit formed on said semiconductor substrate, said RF circuit comprising:
      an RF input port formed on said semiconductor substrate during a ssemiconductor fabrication process;
      an integrated passive inductor formed on said semiconductor subsrtate during said semiconductor fabrication process, said integrated passive inductor having an input end coupled to said RF input port, an output end, and an RF signal line section between said input end and said output end, said RF signal line section having a first side and a second side opposing said first side; and
      an integrated passive capacitor formed on said semiconductor substrate during said semiconductor fabrication process, said integrated passive capacitor being in parallel with said integrated passive inductor; and
   an RF coupler formed on said semiconductor substrate during said semiconductor fabrication process, said RF coupler comprising a first coupling section located proximate to said first side of said RF signal line section, and a second coupling section located proximate to said second side of said RF signal line section.

8. An electronic device according to claim 7, said first coupling section being parallel to said first side of said RF signal line section; and
   said second coupling section being parallel to said second side of said RF signal line section.

9. An electronic device according to claim 7, said first coupling section being directly connected to said second coupling section.

10. An electronic device according to claim 9, said first coupling section having a first output end and a first grounded end;
    said second coupling section having a second output end and a second grounded end;
    said first output end being directly connected to said second output end; and
    said first grounded end being directly connected to said second grounded end.

11. An electronic device according to claim 9, said first coupling section being directly connected to said second coupling section via a bridge that spans said RF signal line section.

12. An electronic device according to claim 9, said first coupling section being directly connected to said second coupling section via a connection section; and
    said RF signal line section comprising a bridge that spans said connection section.

* * * * *

UNITED STATES PATENT AND TRADEMARK OFFICE
CERTIFICATE OF CORRECTION

PATENT NO. : 7,305,223 B2  Page 1 of 1
APPLICATION NO. : 11/021843
DATED : December 23, 2004
INVENTOR(S) : Lianjun Liu It is certified that error appears in the above-identified patent and that said Letters Patent is hereby corrected as shown below:

In Column 11, Line 8, Claim 5:

Change "portion of coupling section being located below" to --portion of said coupling section being located below--

In Column 11, Line 17, Claim 7:

Change "during a ssemiconductor fabrication process;" to --during a semiconductor fabrication process;--

In Column 11, Line 19, Claim 7:

Change "subsrtate during said semiconductor" to --substrate during said semiconductor--

Signed and Sealed this

First Day of July, 2008

JON W. DUDAS
*Director of the United States Patent and Trademark Office*

UNITED STATES PATENT AND TRADEMARK OFFICE
CERTIFICATE OF CORRECTION

PATENT NO.       : 7,305,223 B2
APPLICATION NO.  : 11/021843
DATED            : December 4, 2007
INVENTOR(S)      : Lianjun Liu It is certified that error appears in the above-identified patent and that said Letters Patent is hereby corrected as shown below:

In Column 11, Line 8, Claim 5:

Change "portion of coupling section being located below" to --portion of said coupling section being located below--

In Column 11, Line 17, Claim 7:

Change "during a ssemiconductor fabrication process;" to --during a semiconductor fabrication process;--

In Column 11, Line 19, Claim 7:

Change "subsrtate during said semiconductor" to --substrate during said semiconductor--

This certificate supersedes the Certificate of Correction issued July 1, 2008.

Signed and Sealed this

Twenty-second Day of July, 2008

JON W. DUDAS
*Director of the United States Patent and Trademark Office*